US010985079B2

(12) United States Patent
Nishihara

(10) Patent No.: US 10,985,079 B2
(45) Date of Patent: Apr. 20, 2021

(54) METHOD OF MANUFACTURING SIC EPITAXIAL WAFER

(71) Applicant: SHOWA DENKO K.K., Tokyo (JP)

(72) Inventor: Yoshitaka Nishihara, Chichibu (JP)

(73) Assignee: SHOWA DENKO K.K., Tokyo (JP)

(*) Notice: Subject to any disclaimer, the term of this patent is extended or adjusted under 35 U.S.C. 154(b) by 0 days.

(21) Appl. No.: 16/672,650

(22) Filed: Nov. 4, 2019

(65) Prior Publication Data

US 2020/0152528 A1 May 14, 2020

(30) Foreign Application Priority Data

Nov. 9, 2018 (JP) .............................. JP2018-211273

(51) Int. Cl.
*H01L 21/66* (2006.01)
*H01L 21/02* (2006.01)
(52) U.S. Cl.
CPC ........ *H01L 22/20* (2013.01); *H01L 21/02529* (2013.01); *H01L 21/02634* (2013.01)
(58) Field of Classification Search
CPC ............... H01L 22/20; H01L 21/02634; H01L 21/02529; H01L 21/02502; H01L 21/02447; H01L 21/02378; H01L 21/02658; H01L 22/12; H01L 21/0262; H01L 29/1608; H01L 29/36; C30B 23/02; C30B 23/002
See application file for complete search history.

(56) References Cited

U.S. PATENT DOCUMENTS

| | | | | |
|---|---|---|---|---|
| 9,644,288 B2* | 5/2017 | Sudarshan | ........ | H01L 21/02378 |
| 2005/0064723 A1* | 3/2005 | Sumakeris | ........ | H01L 21/02529 |
| | | | | 438/757 |
| 2009/0085044 A1* | 4/2009 | Ohno | ................ | H01L 21/02529 |
| | | | | 257/77 |
| 2011/0006309 A1* | 1/2011 | Momose | ................ | C30B 29/36 |
| | | | | 257/77 |
| 2019/0040545 A1 | 2/2019 | Nakamura et al. | | |

FOREIGN PATENT DOCUMENTS

| | | |
|---|---|---|
| JP | 2009-088223 A | 4/2009 |
| WO | 2017/094764 A1 | 6/2017 |

* cited by examiner

*Primary Examiner* — Mohammed R Alam
(74) *Attorney, Agent, or Firm* — Sughrue Mion, PLLC

(57) ABSTRACT

The invention provides a method of manufacturing a SiC epitaxial wafer in which stacking faults are less likely to occur when a current is passed in a forward direction. The method of manufacturing the SiC epitaxial wafer includes a measurement step for measuring a basal plane dislocation density, a layer structure determining process for determining the layer structure of the epitaxial layer, and an epitaxial growth step for growing the epitaxial layers. And in the layer structure determination step, in the case of (i) when the basal plane dislocation density is lower than a predetermined value, the epitaxial layer includes a conversion layer and a drift layer from the SiC substrate side; and in the case of (ii) when the density is equal to or higher than the predetermined value, the epitaxial layer includes a conversion layer, a recombination layer, and a drift layer from the SiC substrate side.

4 Claims, 3 Drawing Sheets

METHOD OF MANUFACTURING SIC EPITAXIAL WAFER

BACKGROUND OF THE INVENTION

Field of the Invention

The present invention relates to a method of manufacturing a SiC epitaxial wafer.

Priority is claimed on Japanese Patent Application No. 2018-211273, filed Nov. 9, 2018, the content of which is incorporated by reference.

Description of Related Art

Silicon carbide (SiC) has a dielectric breakdown electric field that is one order of magnitude larger, a band gap that is three times larger, and a thermal conductivity that is about three times higher than silicon (Si). Therefore, silicon carbide (SiC) is expected to be applied to power devices, high frequency devices, high temperature operation devices, and the like.

In order to promote the practical application of SiC devices, high-quality and low-cost SiC epitaxial wafers and the establishment of epitaxial growth technology are required.

The SiC device is formed on a SiC epitaxial wafer including a SiC substrate and an epitaxial layer grown on the substrate. The SiC substrate is obtained by fabricating a bulk single crystal of SiC grown by a sublimation recrystallization method or the like. The epitaxial layer is manufactured by a chemical vapor deposition method (Chemical Vapor Deposition: CVD) or the like and serves as a breakdown voltage maintaining region of the device.

Specifically, the epitaxial layer is formed on the SiC substrate by using a surface having an off angle in a <11-20> direction with respect to a (0001) plane as a growth surface. The epitaxial layer is grown by performing step-flow growth on the SiC substrate (lateral growth from the atomic step) to become 4H—SiC.

In a SiC epitaxial wafer, a basal plane dislocation (BPD) is known as one of device killer defects that cause fatal defects in SiC devices. For example, when a current flows through a bipolar device in a forward direction, a recombination energy of the flowing carriers moves and expands the partial dislocations of the basal plane dislocations inherited from the SiC substrate to the epitaxial layer, forming a high-resistance stacking fault. And when a high resistance part arises in a device, the reliability of the device will be reduced (bipolar degradation). Therefore, an effort to reduce the basal plane dislocations inherited by the epitaxial layer have so far been carried out.

Many of the basal plane dislocations in the SiC substrate can be converted into threading edge dislocations (TED) where no defect expansion occurs when an epitaxial layer is formed (Patent Document 1).

However, it has become clear in recent years that when a large current is applied in the forward direction, the basal plane dislocations which are converted into threading edge dislocations at the interface between the SiC substrate and the epitaxial layer are also expanded to stacking faults (SF) in the epitaxial layer. Therefore, high-current power devices that are expected to expand in the future will not be able to sufficiently suppress the formation of stacking faults simply by converting basal plane dislocations into threading edge dislocations, and concern regarding device reliability deterioration always remains.

Patent Document 2 discloses that the efficiency of converting a basal plane dislocation into a threading edge dislocation at the interface between the SiC substrate and the epitaxial layer is increased by forming an epitaxial layer having a higher impurity concentration in a SiC epitaxial wafer in addition to forming a normal epitaxial layer. By increasing the conversion efficiency of the basal plane dislocation, elongation and expansion of the basal plane dislocation can be suppressed.

The elongation and extension of the basal plane dislocation is the cause of the bipolar degradation of the device. Therefore, the formation of an epitaxial layer with a high impurity concentration has been considered as an effective solution for suppressing bipolar degradation of SiC devices using SiC epitaxial wafers.

[Patent Document 1] Japanese Unexamined Patent Application, First Publication No. 2009-88223 A

[Patent Document 2] WO 2017/094764

SUMMARY OF THE INVENTION

However, adding a step of forming an epitaxial layer (recombination layer) with a higher impurity concentration than the SiC substrate further increases the cost of the originally expensive SiC epitaxial wafer, and as a result manufacturing costs of the production of SiC devices increase. On the other hand, since it is difficult to detect the bipolar degradation in the initial step of characteristics evaluation of SiC devices, there is a risk of making SiC devices, in which bipolar degradation is likely to occur, leave the factory. Therefore, there is a strong demand for SiC epitaxial wafers in which the bipolar degradation is unlikely to occur.

Accordingly, it is an object of the present invention to provide a method of manufacturing a SiC epitaxial wafer in which the bipolar degradation is unlikely to occur when a current is passed in the forward direction and which is low in cost.

As a result of intensive studies, the present inventors have found that when an epitaxial layer is formed on a SiC substrate, there is a case where it is better to provide a recombination layer and a case where it is better not to provide it. It was also found that whether or not a recombination layer should be formed can be determined based on a basal plane dislocation density of the SiC substrate.

The present invention provides the following means in order to solve the above problems.

(1) A method of manufacturing a SiC epitaxial wafer, comprising:

a measurement step of measuring a basal plane dislocation density of a first surface of a SiC substrate;

a layer structure determination step of determining a layer structure of an epitaxial layer grown on the first surface of the SiC substrate based on a measurement result of the measurement step;

an epitaxial growth step of stacking the epitaxial layer on the first surface of the SiC substrate based on the result of the layer structure determination step, wherein in the layer structure determination step, (i) when the basal plane dislocation density is lower than a predetermined value, the epitaxial layer includes, from the SiC substrate side, a conversion layer; and a drift layer, and (ii) when the basal plane dislocation density is equal to or higher than the predetermined value, the epitaxial layer includes, from the SiC substrate side, a conversion layer;
a recombination layer; and
a drift layer, and
wherein the conversion layer has a lower impurity concentration than the SiC substrate, and
the recombination layer has an impurity concentration equal to or higher than that of the conversion layer.

(2) In the method of manufacturing a SiC epitaxial wafer according to the above aspect, the predetermined value may be set to 500/cm$^2$.

(3) The SiC epitaxial wafer manufacturing method according to the above aspect further includes a representative substrate determination step of determining a representative substrate before the measurement step,
wherein the representative substrate determination step is a step of determining at least one SiC substrate as a representative substrate among a plurality of SiC substrates cut out from the same SiC ingot,
the measurement step has a first step and a second step,
the first step is a step of measuring the basal plane dislocation density of the first surface of the representative substrate, and
the second step is a step of determining that a basal plane dislocation density of the plurality of SiC substrates is the same as the basal plane dislocation density of the representative substrate.

(4) In the method for producing a SiC epitaxial wafer according to the above aspect, when a growth end position of the SiC ingot is set to 0, and a growth start position of the SiC ingot is set to 1, the representative substrate determination step is a step of determining at least one representative substrate from a SiC substrates cut out from a position within a range of 0.35 to 0.45.

According to the SiC epitaxial wafer manufacturing method according to the above aspect, it is possible to provide a low-cost method of manufacturing a SiC epitaxial wafer in which bipolar degradation is unlikely to occur when a current is passed in the forward direction.

DETAILED DESCRIPTION OF THE INVENTION

Figure 1:
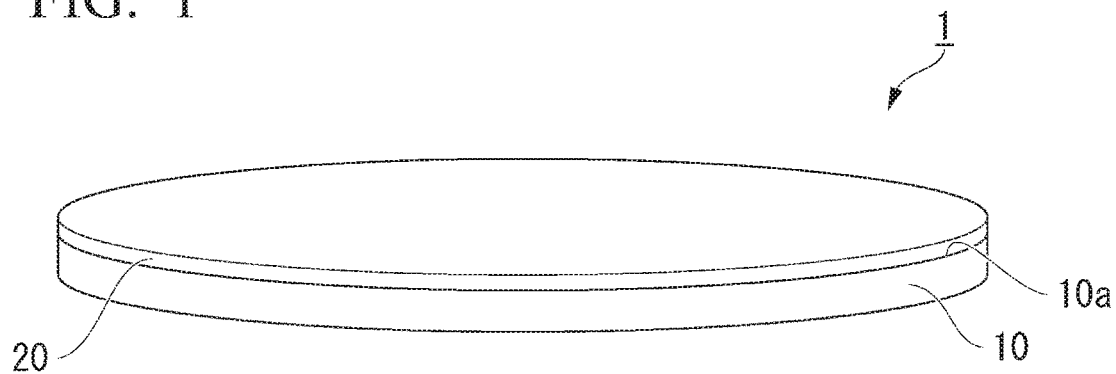
FIG. 1 is a perspective view of a SiC epitaxial wafer manufactured by a method of manufacturing a SiC epitaxial wafer according to an embodiment of the present invention.

Hereinafter, the present embodiment will be described in detail with reference to the accompanying drawings.

In the drawings used in the following description, in order to make the characteristics of the present invention easier to understand, there are cases where the characteristic parts are enlarged for the sake of convenience, and the dimensional ratios of the respective components are different from the actual ones. The materials, dimensions, and the like exemplified in the following description are examples, and the present invention is not limited to them and can be modified and implemented appropriately without changing the gist thereof.

Method of Manufacturing SiC Epitaxial Wafer

The method of manufacturing a SiC epitaxial wafer according to the present embodiment includes a measurement step for measuring a basal plane dislocation density of a first surface of a SiC substrate; a layer structure determination step of determining a layer structure of an epitaxial layer grown on the first surface of the SiC substrate based on a measurement result of the measurement step; and an epitaxial growth step of growing the epitaxial layer on the first surface of the SiC substrate based on the result of the layer structure determination step.

FIG. 1 is a perspective view of a SiC epitaxial wafer manufactured by the method of manufacturing a SiC epitaxial wafer according to the present embodiment. The SiC epitaxial wafer 1 has a SiC substrate 10 and an epitaxial layer 20. The SiC substrate 10 can be obtained by slicing a SiC single crystal produced by a sublimation method or the like. The epitaxial layer 20 is a layer formed on the SiC substrate 10 by chemical vapor deposition or the like. In the present specification, the SiC epitaxial wafer 1 means a wafer after the epitaxial layer 20 is formed, and the SiC substrate 10 means a wafer before the epitaxial layer 20 is formed.

Measurement Step

In the measurement step, the basal plane dislocation density of the first surface 10a of the SiC substrate 10 is measured. The basal plane dislocation density refers to the density of basal plane dislocations present in the SiC substrate 10.

Figure 2:
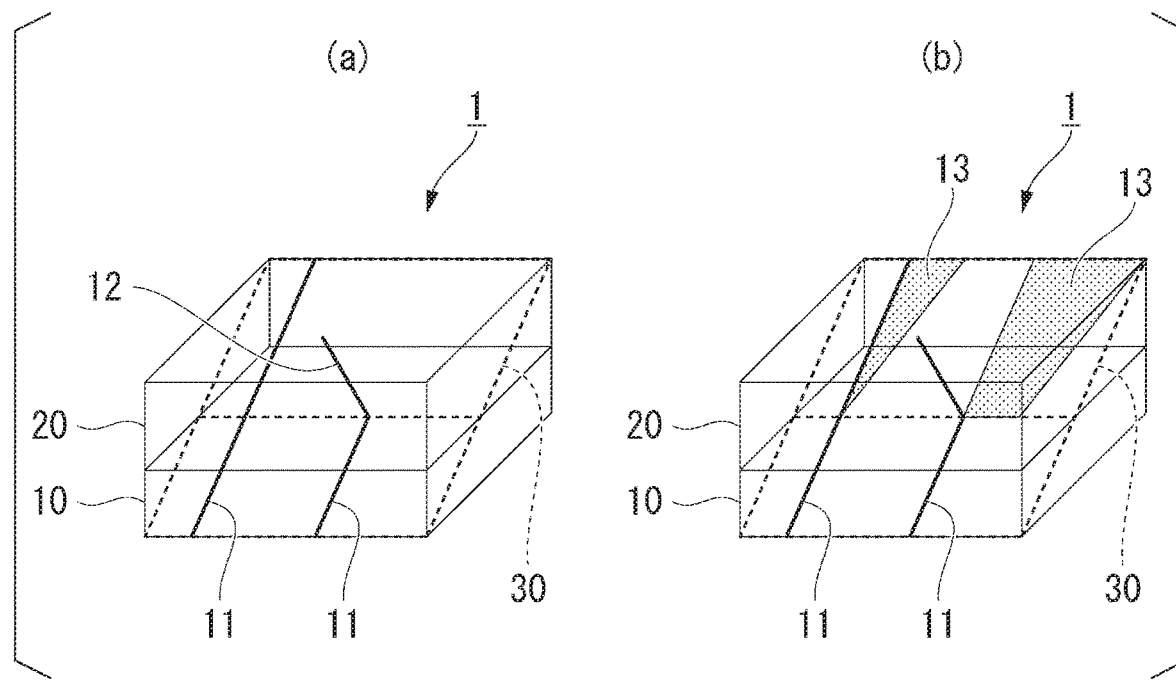
FIG. 2 is a perspective view of a main part of a SiC epitaxial wafer manufactured by the method of manufacturing a SiC epitaxial wafer according to an embodiment of the present invention.

FIG. 2 is a perspective view of the main part of the SiC epitaxial wafer 1. In FIG. 2, (a) shows the SiC epitaxial wafer 1 before a current flows in the forward direction, and (b) shows the SiC epitaxial wafer 1 after a current flows in the forward direction.

The basal plane dislocation (BPD) 11 exists in the SiC substrate 10. The basal plane dislocation 11 is a dislocation existing in the (0001) plane which is the basal plane of the SiC single crystal. The basal plane dislocations 11 include those that are converted into threading edge dislocations 12 and those that remain as basal plane dislocations 11 in the epitaxial layer 20. The threading edge dislocation 12 refers to a dislocation that occurs in a direction perpendicular to the basal plane. Some of the basal plane dislocations 11 or the threading edge dislocations 12 converted from the basal plane dislocations 11 at the interface between the substrate and the epitaxial layer form stacking faults 13 when a current flows in the forward direction. Since the stacking faults 13 becomes a resistance component, the forward resistance increases due to formation of the stacking faults 13. The stacking fault 13 causes bipolar degradation (VF degradation).

In the measurement step, the SiC substrate 10 is prepared first. The method of manufacturing the SiC substrate 10 is not particularly limited. For example, the SiC substrate 10 can be obtained by slicing a SiC ingot obtained by a sublimation method or the like.

The SiC substrate 10 may be doped with nitrogen. The impurity concentration of the SiC substrate 10 is, for example, $1\times10^{18}$ cm$^{-3}$ or more and $2\times10^{19}$ cm$^{-3}$ or less.

Next, the crystal defects of the prepared SiC substrate are measured. Among the measured crystal defects, the basal plane dislocation density (BPD density) is measured. The measurement method is not particularly limited but may be performed using X-ray topography measurement or the like.

In X-ray topography measurement, for example, synchrotron radiation is emitted to the plane orientation (11-28) of the SiC substrate. X-ray diffracted radiation reflected from the SiC wafer to which synchrotron radiation is emitted is observed. A topography image is acquired from the observed X-ray diffracted radiation. As a recording medium, a high-resolution X-ray film, a nuclear plate, or the like may be used. By using the above-mentioned substance as the recording medium, basal plane dislocations, threading edge dislocations, various threading dislocations and stacking faults can be classified from the observed image of X-ray diffracted radiation. And by performing the reflective X-ray topography, the BPD density is obtained by calculating the number of measured basal plane dislocations and the size of the defined region.

Since reflection X-ray topography does not use a destructive inspection method such as etching, the position of crystal defects can be detected non-destructively.

Measurement Step Having First Step and Second Step

Before the measurement step of measuring the basal plane dislocation density of the first surface of the SiC substrate, the method of manufacturing a SiC epitaxial wafer may further include a representative substrate determination step, which will be described later. When performing the representative substrate determination step before the measurement step, the measurement step may be a measurement step having a first step and a second step.

First Step

The first step is a step of measuring the BPD density of the first surface of the representative substrate which has been determined in the later-described representative substrate determination step. The measurement of the BPD density of the representative substrate can be performed by the same method as the measurement of the BPD density without the representative substrate determination step.

Second Step

The second step is a step of determining that the BPD density of the plurality of SiC substrates cut out from the same SiC ingot is the same as the BPD density of the representative substrate.

Figure 3:
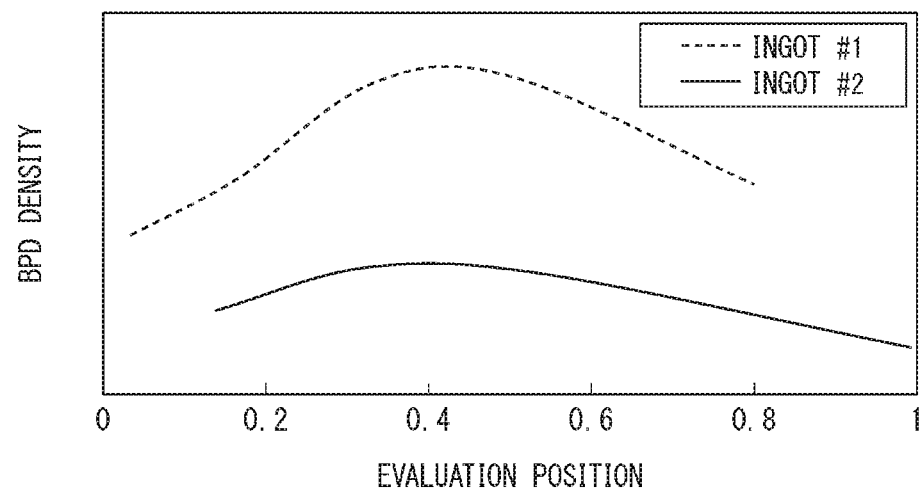
FIG. 3 is a graph showing an example of the distribution of BPD density in the SiC ingot.

When a plurality of substrates are determined as representative substrates, the BPD densities of the plurality of SiC substrates cut out from the same SiC ingot can be determined as appropriate, based on both of the distribution of BPD density shown in FIG. 3 and the measured BPD densities of the plurality of representative substrates. The BPD density may be regarded as the same as the BPD density of the representative SiC substrate close to the relative position, or may be regarded as the same or lower than that of the representative substrate having the highest BPD density.

For example, when the BPD density of the representative substrate having a relative position within a range of 0.35 to 0.45 is lower than 500, the BPD density of the SiC substrate cut out from the same SiC ingot may be considered to be all equal to or lower than that of the representative substrate.

In addition, SiC substrates having a relative position within a range of 0.3, 0.4, and 0.5 are designated as representative substrates A, B, and C, respectively. The case where the BPD density of the representative substrates A, B, and C are 450, 600, and 450, respectively, is taken as an example. In this case, the BPD density of the SiC substrate having a relative position within a range of 0 to 0.3 is regarded as the same as the BPD density of the representative substrate A, and the BPD density of the SiC substrate having a relative position within a range of 0.5 to 1 is regarded as the same as the BPD density of the representative substrate C. The BPD density of the SiC substrate having a relative position within a range of 0.3 to 0.5 may be regarded as the same as the BPD density of the representative substrate A; or may be regarded as the same as the BPD density of the representative substrate B. Alternatively, a SiC substrate having a relative position within a range of 0 to 0.35 may be regarded as being the same as the BPD density of the representative substrate A, and a SiC substrate having a relative position within a range of 0.35 to 0.45 may be regarded as being the same as the BPD density of the representative substrate B. A SiC substrate having a relative position within a range of 0.45 to 1.0 may be regarded as being the same as the BPD density of the representative substrate C.

By performing a representative substrate determination step, which will be described later, and a measurement step having the first step and the second step, the number of SiC substrates to be measured can be suppressed, and the number of steps involved in the measurement step can be reduced. This leads to reduced manufacturing costs.

Representative Substrate Determination Step

The method of manufacturing a SiC epitaxial wafer may further include a representative substrate determination step before the measurement step. The representative substrate determination step is a step of determining at least one representative substrate to be measured among a plurality of SiC substrates cut out from the same SiC ingot.

Regarding various dislocation densities such as basal plane dislocation densities and threading edge dislocation densities of the SiC substrate, it is possible to determine whether the dislocation density of a SiC substrate cut out from the same SiC ingot is below a predetermined value, by measuring at least one of the SiC substrates cut out from the SiC ingot. Generally, there is a distribution in the dislocation density in the SiC ingot, and it is known that the distribution has the same tendency even if the dislocation density included in each SiC ingot is different. FIG. 3 shows the distribution of BPD density in two SiC ingots. The horizontal axis represents the relative position of the cut-out SiC substrate with respect to the SiC ingot where the tip position of the SiC ingot is set to 0, and the root position is set to 1. That is, it represents the relative position of the cut-out SiC substrate with respect to the SiC ingot in which the growth end position of the SiC ingot is set to 0, and the growth start position is set to 1.

From the result of FIG. 3, for example, by measuring the BPD density of the SiC substrate cut out from the positions of 0.35 to 0.45 of the SiC ingot, the obtained value can be used as the maximum value of the BPD densities of the SiC substrates manufactured from the same SiC ingot. In the representative substrate determination step, an arbitrary SiC substrate cut out from the SiC ingot can be determined as the representative substrate. Preferably, a SiC substrate cut out from a position where the relative position is within a range of 0.35 to 0.45 can be used.

In the representative substrate determination step, a plurality of SiC substrates cut out from the same SiC ingot may be used as the representative substrate. When a plurality of SiC substrates are used as representative substrates, it is preferable that one of the plurality of SiC substrates be cut out from a range of relative positions within a range of 0.35 to 0.45, and more preferably that a plurality of SiC substrates be cut out from the range within a range of 0.35 to 0.45.

Layer Structure Determination Step

Figure 4:
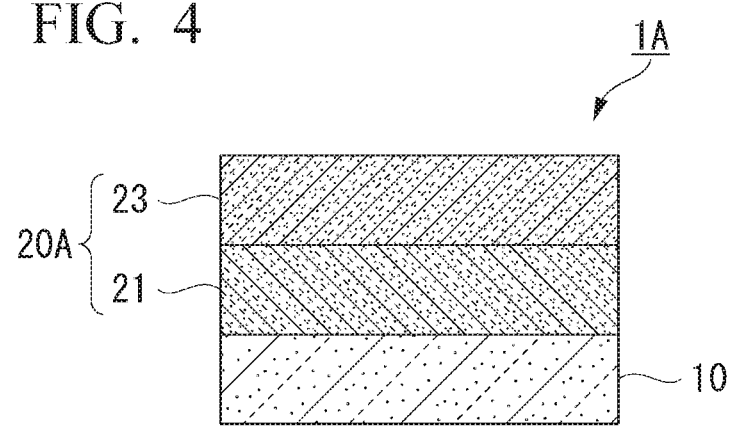
FIG. 4 is a cross-sectional view of a SiC epitaxial wafer manufactured by the method of manufacturing a SiC epitaxial wafer according to an embodiment of the present invention.
Figure 5:
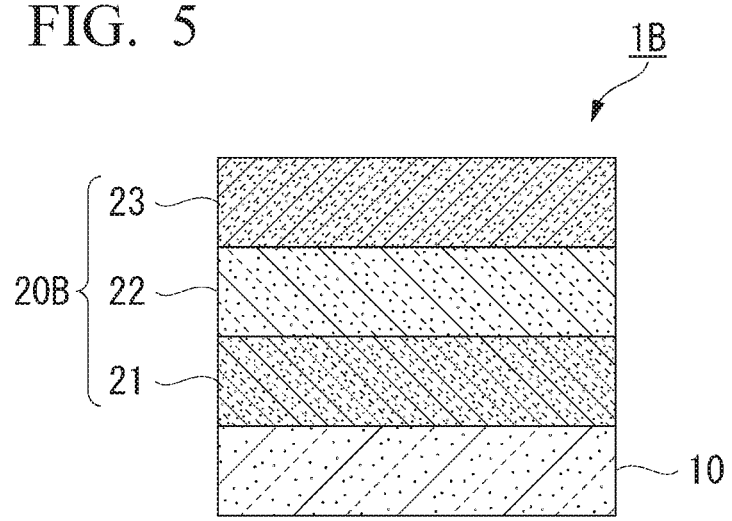
FIG. 5 is a cross-sectional view of another example of a SiC epitaxial wafer manufactured by the method of manufacturing a SiC epitaxial wafer according to an embodiment of the present invention.

In the layer structure determination step, the layer structure of the epitaxial layer 20 to be grown on the first surface 10a of the SiC substrate 10 is determined. FIGS. 4 and 5 are sectional views of the SiC epitaxial wafer manufactured by the method of manufacturing a SiC epitaxial wafer according to the present embodiment.

A SiC epitaxial wafer 1A shown in FIG. 4 includes a SiC substrate 10 and an epitaxial layer 20A. Epitaxial layer 20A includes a conversion layer 21 and a drift layer 23.

The conversion layer 21 and the drift layer 23 are doped with impurities. The conversion layer 21 has a lower impurity concentration than the SiC substrate 10. The drift layer 23 is a layer in which a drift current flows and a layer which functions as a device. A drift current is a current generated by the flow of carriers when a voltage is applied to a semiconductor. The impurity concentration of the drift layer 23 is, for example, $1 \times 10^{14}$ cm$^{-3}$ or more.

A SiC epitaxial wafer 1B shown in FIG. 5 includes a SiC substrate 10 and an epitaxial layer 20B. The epitaxial layer 20B includes a conversion layer 21, a recombination layer 22, and a drift layer 23. The conversion layer 21, the recombination layer 22, and the drift layer 23 are doped with impurities. The recombination layer 22 is a layer having an impurity concentration equal to or higher than that of the conversion layer 21.

In the layer structure determination step, the layer structure of the epitaxial layers 20A or 20B grown on the SiC substrate 10 is determined. That is, it is determined whether the epitaxial layer is the epitaxial layer 20A or the epitaxial layer 20B.

Figure 6:
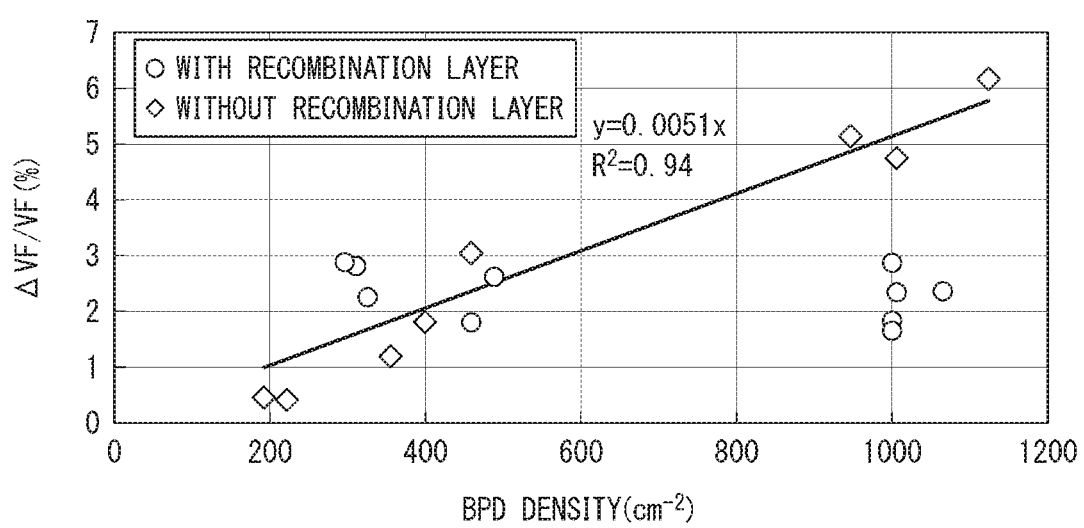
FIG. 6 is a graph showing the relationship between the BPD density and the degree of bipolar degradation occurring in the SiC epitaxial wafer.

FIG. 6 is a graph showing the relationship between the BPD density and the degree of VF degradation of the SiC epitaxial wafer 1. The horizontal axis represents the BPD density on the first surface 10a of the SiC substrate 10.

The vertical axis is an index indicating the degree of VF degradation. Specifically, it is a value normalized by dividing the VF degradation amount ΔVF at a certain current value by the initial voltage value VF. Squares in the graph indicate the degree of VF degradation occurring in the epitaxial layer 20A having the configuration shown in FIG. 4. Circles in the graph indicate the degree of VF degradation occurring in the epitaxial layer 20B having the configuration shown in FIG. 5.

As shown in the graph of FIG. 6, when the BPD density of the first surface 10a of the SiC substrate 10 is higher than a predetermined value, VF degradation is less likely to occur in the SiC epitaxial wafer 1B having the configuration shown in FIG. 5, compared with the SiC epitaxial wafer 1A having the configuration shown in FIG. 4.

However, as the BPD density of the first surface 10a of the SiC substrate 10 decreases, the VF degradation of the SiC epitaxial wafer 1A decreases. On the other hand, the degree of VF degradation of the SiC epitaxial wafer 1B is constant regardless of the BPD density. Therefore, when the BPD density is lower than the predetermined value, VF degradation is less likely to occur in the SiC epitaxial wafer 1A having the configuration shown in FIG. 4, compared with the SiC epitaxial wafer 1B having the configuration shown in FIG. 5 The cause of the result is not clear, but it is considered to be as follows. In the SiC epitaxial wafer 1A having the configuration shown in FIG. 4, the amount of VF degradation decreases due to a decrease in BPD density which contributes to VF degradation. However, in the SiC epitaxial wafer 1B having the configuration shown in FIG. 5, since the thickness of the epitaxial layer is increased by forming the recombination layer, the area of the expanded stacking faults is increased. As a result, the amount of VF degradation is increased. Therefore, it is considered that VF degradation is less likely to occur in the SiC epitaxial wafer 1A having the configuration shown in FIG. 4 compared with the SiC epitaxial wafer 1B having the configuration shown in FIG. 5, when the BPD density is lower than the predetermined value.

As shown in FIG. 6, the layer structure of the epitaxial layer 20 in which VF degradation is unlikely to occur depends on the BPD density of the first surface 10a of the SiC substrate 10.

When the BPD density measured in the measurement step is equal to or higher than the predetermined value, the configuration of the SiC epitaxial wafer 1B is selected. That is, the epitaxial layer 20B includes the conversion layer 21, the recombination layer 22, and the drift layer 23 from the SiC substrate 10 side.

On the other hand, when the BPD density is lower than the predetermined value, the configuration of the SiC epitaxial wafer 1A is selected. That is, the epitaxial layer 20A includes the conversion layer 21 and the drift layer 23 from the SiC substrate 10 side. In other words, when the BPD density is lower than a predetermined value, VF degradation can be suppressed by not providing the recombination layer 22.

When the representative substrate determination step and the measurement step including the first step and the second step are performed, the layer structure is determined by comparing the BPD density of each SiC substrate determined in the second step with a predetermined value.

Epitaxial Growth Step

In the epitaxial growth step, the epitaxial layer 20 is grown on the first surface 10a of the SiC substrate 10 based on the result of the layer structure determination step.

The different layer structures of the epitaxial layer 20 may be decided depending on whether the BPD density of the SiC substrate 10 is higher or lower than the predetermined value. When the BPD density is equal to or higher than the predetermined value, the epitaxial layer 20B is used. When the BPD density is lower than the predetermined value, the epitaxial layer 20A is used.

The method of epitaxially growing the epitaxial layer 20 on the first surface 10a of the SiC substrate 10 is not particularly limited. For example, the epitaxial layer 20 is grown by a chemical vapor deposition (CVD) method or the like. Nitrogen, boron, titanium, vanadium, aluminum, gallium, phosphorus, or the like can be used as the impurity doped into the epitaxial layer 20.

Hereinafter, each layer of the conversion layer 21, the recombination layer 22, and the drift layer 23 will be described in detail.

The conversion layer 21 is, for example, an epitaxial layer doped with nitrogen. The conversion layer 21 is an n-type or p-type semiconductor having a lower impurity concentration than the SiC substrate 10. The conversion layer 21 converts the basal plane dislocation 11 into the threading edge dislocation 12.

The impurity concentration of the conversion layer 21 is preferably lower than that of the SiC substrate 10 and is preferably lower than the impurity concentration of the recombination layer 22. The value of the impurity concentration of the conversion layer 21 is preferably $1 \times 10^{17}$ cm$^{-3}$ or more. The value of the impurity concentration of the conversion layer 21 is preferably $2 \times 10^{19}$ cm$^{-3}$ or less. The impurity concentration of the conversion layer 21 is set to be intermediate between the impurity concentrations of the SiC substrate 10 and the drift layer 23 in order to alleviate a lattice mismatch.

The recombination layer 22 reduces the probability that a small number of carriers reach the SiC substrate 10 when a voltage is applied to a bipolar device in the forward direction wherein the bipolar device uses the SiC epitaxial wafer 1 having BPD. As a result, it is possible to prevent BPD from expanding and forming a Shockley-type stacking fault in the epitaxial layer 20. That is, the recombination layer 22 is a layer for suppressing bipolar degradation of the device.

When forming the recombination layer 22, it is preferable to determine the carrier concentration and film thickness of the recombination layer 22 according to the BPD density of the SiC substrate 10.

By promoting electron-hole recombination, the recombination layer 22 suppresses carrier recombination in the vicinity of the BPD existing in the SiC substrate and near the interface between the recombination layer 22 and the conversion layer 21. Thereby, expansion of BPD existing in the SiC substrate and in the conversion layer below the recombination layer is suppressed, and as a result, VF degradation of the bipolar SiC device can be suppressed. Specifically, it is possible to prevent an increase in on-resistance of the SiC-MOSFET provided with a body diode.

The drift layer 23 is a layer where a SiC device is to be formed. If BPD is included in the drift layer 23, it will cause bipolar degradation of the SiC device. The impurity concentration of the drift layer 23 is lower than that of the recombination layer 22 and is preferably about $1 \times 10^{14}$ cm$^{-3}$ or more. The film thickness of the drift layer 23 is preferably about 5 μm or more.

As described above, according to the method of manufacturing a SiC epitaxial wafer of the present embodiment, the SiC device which is unlikely become degradation in the forward direction can be formed by determining an appropriate epitaxial layer structure on the SiC substrate 10 and stacking the determined layer structure. Further, since the recombination layer 22 is not required for the SiC substrate 10 having a BPD density lower than the predetermined value, the manufacturing cost can be reduced. For a SiC substrate 10 having a BPD density higher than the predetermined value, by growing a recombination layer 22 having an impurity concentration and thickness which are considered to be necessary, even if a substrate having a high BPD density is used, a device can be manufactured with a high yield.

The preferred embodiments of the present invention have been described in detail above. However, the present invention is not limited to the specific embodiments, and various modifications and changes can be made within the scope of the gist of the present invention described in the claims.

INDUSTRIAL APPLICABILITY

As described above, the method of manufacturing a SiC epitaxial wafer according to the present invention a high-quality SiC epitaxial wafer includes measuring the BPD density of the SiC substrate and forming a layer having a layer structure suitable for manufacturing. And the method of the present invention is useful to manufacture a SiC epitaxial wafer in a low cost wherein the SiC epitaxial wafer is unlikely to deteriorate even when current is applied in the forward direction of the SiC device.

DESCRIPTION/EXPLANATION OF REFERENCES 1, 1A, 1B: SiC epitaxial wafer
10: SiC substrate
11: Basal plane dislocation (BPD)
12: Threading edge dislocation (TED)
13: Stacking fault (SF)
20, 20A, 20B: Epitaxial layer
21: Conversion layer
22: Recombination layer
23: Drift layer

What is claimed is:
1. A method of manufacturing a SiC epitaxial wafer, comprising:
a measurement step of measuring a basal plane dislocation density of a first surface of a SiC substrate;
a layer structure determination step of determining a layer structure of an epitaxial layer grown on the first surface of the SiC substrate based on a measurement result of the measurement step;
an epitaxial growth step of growing the epitaxial layer on the first surface of the SiC substrate based on the result of the layer structure determination step,
wherein in the layer structure determination step,
(i) when the basal plane dislocation density is lower than a predetermined value, the epitaxial layer comprises, from the SiC substrate side,
a conversion layer; and
a drift layer, and
(ii) when the basal plane dislocation density is equal to or higher than the predetermined value,
the epitaxial layer comprises, from the SiC substrate side,
a conversion layer;
a recombination layer; and
a drift layer, and
wherein the conversion layer has a lower impurity concentration than the SiC substrate, and
the recombination layer has an impurity concentration equal to or higher than that of the conversion layer.
2. The method of manufacturing a SiC epitaxial wafer according to claim 1, wherein the predetermined value is 500/cm$^2$.
3. The method of manufacturing a SiC epitaxial wafer according to claim 1, further comprising:
a representative substrate determination step of determining a representative substrate before the measurement step, wherein the representative substrate determination step is a step of determining at least one SiC substrate as a representative substrate among a plurality of SiC substrates cut out from the same SiC ingot, the measurement step has a first step and a second step, the first step is a step of measuring the basal plane dislocation density of the first surface of the representative substrate, and the second step is a step of determining that a basal plane dislocation density of the plurality of SiC substrates is the same as the basal plane dislocation density of the representative substrate.

4. The method for producing a SiC epitaxial wafer according to claim 3, wherein when a growth end position of the SiC ingot is set to 0, and a growth start position of the SiC ingot is set to 1, the representative substrate determination step is a step of determining at least one representative substrate from the SiC substrates cut out from a position within a range of 0.35 to 0.45.

* * * * *